(12) United States Patent
Morin

(10) Patent No.: US 7,892,633 B2
(45) Date of Patent: Feb. 22, 2011

(54) LOW DIELECTRIC COMPOSITE MATERIALS INCLUDING HIGH MODULUS POLYOLEFIN FIBERS

(75) Inventor: Brian G. Morin, Greenville, SC (US)

(73) Assignee: Innegrity, LLC, Greenville, SC (US)

( * ) Notice: Subject to any disclaimer, the term of this patent is extended or adjusted under 35 U.S.C. 154(b) by 357 days.

(21) Appl. No.: 11/205,662

(22) Filed: Aug. 17, 2005

(65) Prior Publication Data

US 2007/0290942 A1 Dec. 20, 2007

(51) Int. Cl.
*D04H 3/00* (2006.01)
*D03D 15/00* (2006.01)
*B32B 5/26* (2006.01)
*B32B 27/12* (2006.01)
*B32B 27/32* (2006.01)

(52) U.S. Cl. .................. 428/292.1; 428/221; 442/189; 442/268; 442/286; 442/290

(58) Field of Classification Search .................. 343/872; 428/221, 292.1; 442/189, 268, 286, 290
See application file for complete search history.

(56) References Cited

U.S. PATENT DOCUMENTS

| | | |
|---|---|---|
| 3,936,996 A | 2/1976 | Schiffer |
| 3,969,885 A | 7/1976 | Anahara et al. |
| 4,016,118 A | 4/1977 | Hamada et al. |
| 4,137,394 A | 1/1979 | Meihuizen et al. |
| 4,413,110 A | 11/1983 | Kavesh et al. |

(Continued)

FOREIGN PATENT DOCUMENTS

DE 3539185 A * 6/1986

(Continued)

OTHER PUBLICATIONS

Article—*Crystallization Under Non-Isothermal Conditions* from Textile Science and Technology 5 (Polypropylene Fibers—Science and Technology), M. Ahmed, 1982, pp. 192-203.

(Continued)

*Primary Examiner*—D. Lawrence Tarazano
*Assistant Examiner*—Matthew D Matzek
(74) *Attorney, Agent, or Firm*—Wyatt, Tarrant & Combs, LLP; William S. Parks

(57) ABSTRACT

Disclosed are composite laminates that can exhibit high strength and/or low dielectric loss and can also be lightweight. The laminates include layers formed of high modulus polyolefin fiber. The fibers can be woven or knit to form a fabric or can be included in a nonwoven fabric that can be one or more layers of the composite structures. The layers including the high modulus polyolefin fibers can include other fibers, such as fiberglass. The composites can also include layers of other materials, for instance layers formed of polyaramids, fiberglass, or carbon fiber wovens or nonwovens. The composites can advantageously be utilized in low loss dielectric applications, such as in forming circuit board substrates, or in applications beneficially combining strength with low weight, such as automobile and boat materials.

12 Claims, 8 Drawing Sheets

U.S. PATENT DOCUMENTS

| | | | |
|---|---|---|---|
| 4,430,852 A | | 2/1984 | Hatcher |
| 4,560,734 A | | 12/1985 | Fujishita et al. |
| 4,886,699 A | | 12/1989 | Carroll et al. |
| 5,115,077 A | | 5/1992 | Matsuo et al. |
| 5,149,590 A | | 9/1992 | Arthur et al. |
| 5,190,809 A | * | 3/1993 | Marissen et al. ............ 442/198 |
| 5,329,695 A | | 7/1994 | Traskos et al. |
| 5,358,775 A | | 10/1994 | Horn, III |
| 5,408,244 A | * | 4/1995 | Mackenzie .................. 343/872 |
| 5,462,790 A | | 10/1995 | Matsuki et al. |
| 5,576,366 A | | 11/1996 | Sheth |
| 5,614,574 A | | 3/1997 | Sheth |
| 5,736,244 A | | 4/1998 | Kavesh et al. |
| 5,798,167 A | | 8/1998 | Connor et al. |
| 5,846,654 A | | 12/1998 | Modrak |
| 5,955,196 A | | 9/1999 | Sakellerides |
| 5,958,582 A | | 9/1999 | Dunbar et al. |
| 5,972,498 A | | 10/1999 | Kavesh et al. |
| 5,995,196 A | | 11/1999 | Nishida et al. |
| 6,041,587 A | | 3/2000 | Gabalda et al. |
| 6,045,923 A | | 4/2000 | Kok et al. |
| 6,102,999 A | | 8/2000 | Cobb, III et al. |
| 6,110,588 A | | 8/2000 | Perez et al. |
| 6,155,084 A | | 12/2000 | Andrews et al. |
| 6,254,816 B1 | | 7/2001 | Klaus et al. |
| 6,331,343 B1 | | 12/2001 | Perez et al. |
| 6,420,024 B1 | | 7/2002 | Perez et al. |
| 6,458,727 B1 | | 10/2002 | Jones et al. |
| 6,468,451 B1 | | 10/2002 | Perez et al. |
| 6,526,739 B2 | | 3/2003 | Kutsenko et al. |
| 6,534,574 B1 | | 3/2003 | Zhao et al. |
| 6,541,544 B1 | | 4/2003 | Hart et al. |
| 6,541,554 B2 | | 4/2003 | Morin et al. |
| 6,586,073 B2 | | 7/2003 | Perez et al. |
| 6,592,790 B2 | | 7/2003 | Reider et al. |
| 6,630,231 B2 | | 10/2003 | Perez et al. |
| 6,645,618 B2 | | 11/2003 | Hobbs et al. |
| 6,656,404 B2 | | 12/2003 | Morin et al. |
| 6,679,754 B2 | | 1/2004 | Li et al. |
| 6,680,114 B2 | | 1/2004 | Kody et al. |
| 6,692,823 B2 | | 2/2004 | Kody et al. |
| 6,701,703 B2 | | 3/2004 | Patrick |
| 6,759,124 B2 | | 7/2004 | Royer et al. |
| 6,784,765 B2 | | 8/2004 | Yamada et al. |
| 6,823,699 B1 | | 11/2004 | Vero et al. |
| 6,831,234 B1 | | 12/2004 | Asai et al. |
| 6,848,151 B2 | | 2/2005 | Bakker et al. |
| 6,860,000 B2 | | 3/2005 | Felten |
| 6,861,588 B2 | | 3/2005 | Sakai et al. |
| 6,863,976 B2 | | 3/2005 | Morin et al. |
| 6,876,088 B2 | | 4/2005 | Harvey |
| 6,878,437 B1 | | 4/2005 | Crane |
| 6,890,635 B2 | | 5/2005 | Lin et al. |
| 6,890,638 B2 | | 5/2005 | Nguyen et al. |
| 6,902,800 B2 | | 6/2005 | Woolstencroft |
| 6,916,533 B2 | | 7/2005 | Simmelink et al. |
| 6,977,113 B2 | | 12/2005 | Kody et al. |
| 2002/0190432 A1 | | 12/2002 | Shiwaku et al. |
| 2003/0044592 A1 | | 3/2003 | Perez et al. |
| 2003/0068481 A1 | * | 4/2003 | Kody et al. ............... 428/292.1 |
| 2003/0216498 A1 | | 11/2003 | Morin et al. |
| 2004/0007794 A1 | | 1/2004 | Morin et al. |
| 2004/0028884 A1 | * | 2/2004 | Woolstencroft .......... 428/292.1 |
| 2004/0096621 A1 | | 5/2004 | Dai et al. |
| 2004/0096639 A1 | | 5/2004 | Morin et al. |
| 2004/0096653 A1 | | 5/2004 | Cowan et al. |
| 2004/0096661 A1 | | 5/2004 | Royer et al. |
| 2004/0105978 A1 | | 6/2004 | Morin et al. |
| 2004/0152815 A1 | | 8/2004 | Morin et al. |

FOREIGN PATENT DOCUMENTS

| | | | |
|---|---|---|---|
| GB | 2042414 A | * | 9/1980 |

OTHER PUBLICATIONS

Article—*High Performance Fibers* from Structure Formation in Polymeric Fibers, David R. Salem, Editor, 2001, pp. 172-173.

Article—*High-Tenacity Industrial Yarns* from Textile Science and Technology 5 (Polypropylene Fibers—Science and Technology), M. Ahmed, 1982, pp. 389-403.

Article—*Materials: The New Polypropylenes—They've Got More of Everything* from Plastics Technology, Lilli Manolis Sherman, Sr. Editor, 6 pages, www.plasticstechnology.com.

Article—*New Clarifiers & Nucleators: They Make Polypropylene Run Clearer and Faster* from Plastics Technology, Lilli Manolis Sherman, Sr. Editor, 5 pages, www.plasticstechnology.com.

Article—*Patented Advances in Fiber Melt Spinning* from Structure Formation in Polymeric Fibers, David R. Salem, Editor, 2001, pp. 105-112.

Article—*Polypropylene Fibres: Exploration of Conditions Resulting in High Tenacity*, I.-C. Wang, M.G. Dobb et al., J. Text. Inst., 87 Part 1, No. 1, 1996, pp. 1-12.

Article—*Superdrawn Filaments of Polypropylene*, W. N. Taylor, Jr. et al., Polymer Engineering and Science, vol. 18, No. 6, Mid-May 1978, pp. 518-526.

Article—*Synergistic gelation of solutions of isotactic polypropylene and bis-(3,4-dimethyl benzylidene) sorbitol and its use in gel-processing*, Magnus Kristiansen et al., Polymer 44, 2003, pp. 5885-5891.

Article—*The Preparation of Ultra-High Modulus Polypropylene Films and Fibres*, D. L. M. Cansfield et al., Polymer Engineering and Science, vol. 16, No. 11, Nov. 1976, pp. 721-724.

Schematic from Structure Formation in Polymeric Fibers, David R. Salem, Editor, 2001, p. 56.

Product Information Sheets on PURE® from Lankhorst Indutech b.v., 10 pages, www.pure-composites.com.

Brian G. Morin, U.S. Appl. No. 10/983,153, filed Nov. 5, 2004, Melt-Spun Multifilament Polyolefin Yarn Formation Processes and Yarns Formed Therefrom.

Brian G. Morin, U.S. Appl. No. 11/149,887, filed Jun. 10, 2005, Polypropylene Fiber for Reinforcement of Matrix Materials.

Brian G. Morin, U.S. Appl. No. 11/205,575, filed Aug. 17, 2005, Composite Materials Including High Modulus Polyolefin Fibers.

Brian G. Morin, U.S. Appl. No. 11/205,661, filed Aug. 17, 2005, Methods of Forming Composite Materials Including High Modulus Polyolefin Fibers.

Non-Final Office Action in U.S. Appl. No. 10/983,153, now US Patent 7,074,483, dated Oct. 20, 2005.

Notice of Allowance in U.S. Appl. No. 10/983,153, now US Patent 7,074,483, dated Feb. 17, 2006.

Non-Final Office Action in U.S. Appl. No. 11/483,515, now US Patent 7,445,842, dated Oct. 29, 2007.

Final Office Action in U.S. Appl. No. 11/483,515, now U.S. Appl. No. 7,445,842, dated May 1, 2008.

Notice of Allowance in U.S. Appl. No. 11/483,515, now US Patent 7,445,842, dated Jun. 2, 2008.

Non-Final Office Action in U.S. Appl. No. 11/149,887, now US Patent 7,445,834, dated Feb. 14, 2008.

Non-Final Office Action in U.S. Appl. No. 11/149,887, now US Patent 7,445,834, dated Aug. 7, 2008.

Notice of Allowance in U.S. Appl. No. 11/149,887, now US Patent 7,445,834, dated Jul. 9, 2008.

Non-Final Office Action in co-pending U.S. Appl. No. 11/205,661, dated Mar. 28, 2008.

Final Office Action in co-pending U.S. Appl. No. 11/205,661, dated Jul. 15, 2008.

Advisory Action in co-pending U. S. Appl. No. 11/205,661, dated Oct. 22, 2008.

Non-Final Office Action in co-pending U. S. Appl. No. 11/205,661, dated Jan. 30, 2009.
Final Office Action in co-pending U. S. Appl. 11/205,661, dated Jun. 10, 2009.
Non-Final Office Action in co-pending U.S. Appl. No. 11/438,530 dated Jul. 9, 2009.

Notice of Allowance and Fee(s) Due, dated Sep. 17, 2009 in U.S. Appl. No. 11/205,661.

* cited by examiner

LOW DIELECTRIC COMPOSITE MATERIALS INCLUDING HIGH MODULUS POLYOLEFIN FIBERS

BACKGROUND OF THE INVENTION

Composite materials have been developed in many fields in order to obtain products that maintain the desirable characteristics of each component, while minimizing the less desirable characteristics. For instance, glass fibers can offer excellent tensile strength characteristics, but have a dielectric constant of about 6, and thus are often unsuitable for electrical applications at high usage rates. However, glass fibers can be combined with resins, such as certain fluorocarbon resins, that exhibit desirable electrical characteristics to form composite materials having good electrical as well as physical properties.

Other fibrous composite materials, for instance those providing high strength, often include highly engineered fibers such as glass fibers, steel fibers, carbon fibers, Kevlar® fibers (poly-paraphenylene terephthalamide), and the like, held in a stable matrix. These materials can offer excellent strength characteristics but can also be very dense, which can be problematic where weight of the product is a factor, e.g., body armor, automobile parts, boat materials, etc.

Moreover, when the composite materials must be designed to meet high engineering specifications, cost can begin to be a problem. For instance, in order to meet engineering specifications with regard to flexibility, modulus, density, electrical characteristics, and the like, though various combinations of different materials might be found that can form a composite material to meet the specifications, formation and materials costs often become prohibitive. As a result, characteristics must often be relinquished in order to provide an affordable product to the consumer.

Polyolefin materials can bring many desirable characteristics to composites. For example, polyolefin materials can be resistant to degradation and erosion, the raw materials can be easy to obtain as well as fairly inexpensive, and they can have low density and dielectric loss characteristics. Unfortunately, the low strength characteristics of polyolefin yarns and fibers have been such that even when combined with a secondary, relatively strong material in a composite, the strength requirements of the desired application have not been met. Moreover, as these polymers are generally nonpolar by nature, they often cannot be utilized with known thermoset resins common to fibrous composites, as a strong bond between the thermoset matrix and the polyolefin fiber cannot be formed.

While there have been improvements in polyolefin fibers and composite materials incorporating fibrous polymeric materials, there remains room for further improvement and variation within the art.

SUMMARY OF THE INVENTION

The present invention is directed to multi-layer composite structures, methods for forming the structures, and methods for using the structures. In one embodiment, the disclosed structures can include a first layer including a semi-crystalline polyolefin fiber having a modulus greater than about 8 GPa, and even higher in other embodiments, and a maximum cross-sectional dimension less than about 100 μm. The polyolefin fibers can also exhibit a high tenacity, for example greater than about 400 MPa and can have a low density, for instance less than about 1.3 g/cm$^3$, in one embodiment. The composite structures also include a second layer that can be the same as or different from the first layer and a polymeric binding agent that can secure the layers one to another. In one embodiment, the polyolefin can be a polypropylene. In one particular embodiment, the polyolefin fiber can be formed via a melt extrusion process, for instance in a melt extrusion process involving a draw with a draw ratio of at least about 6.

In one embodiment, the first layer including the polyolefin fiber can be a weave fabric or a nonwoven. Optionally, the fabric can include composite yarns that include the polyolefin fiber in combination with a second fiber, e.g., glass, carbon, polyaramids, or the like. In one embodiment, the fabric can include high modulus polyolefin yarns as well as fibers of other materials, e.g., glass fibers, etc.

The second layer of the composite structures can be identical to or different from the first layer, as desired. For instance, the second layer can also include the high modulus polyolefin fibers in the same or a different arrangement as the first layer, or can be formed from completely different materials. For example, the second layer can be a fiberglass woven or nonwoven, a woven or nonwoven including another type of fiber that can be held in a polymeric matrix, or a metal construct.

The binding agent of the composite can be a thermoplastic or a thermoset. For example, the binding agent can be a thermoplastic film or resin placed between the layers or coated onto the fibers or formed layers, and the composite can be shaped and cured in a compression molding process that can include placing the construct under heat and/or pressure.

Optionally, the binding agent can be a thermoset resin. For instance the thermoset resin can be an epoxy thermoset resin. A thermoset resin can be included in the composite according to any process. For instance, the thermoset resin can be applied to the high modulus polyolefin fibers, to the polyolefin-containing layer(s), and/or to the materials forming a second, different layer of the composite. For instance, the thermoset resin that can bind the layers together can also form a polymeric matrix about the fibers of another layer, e.g., a fiberglass layer.

In certain embodiments, it can be beneficial to pre-treat the fibers and/or the finished layers prior to securing the layers together so as to improve the bonding strength of the composite. For example, it may be beneficial to oxidize materials of the layers, so as to promote stronger bond formation between the layers and the binding agents. In one embodiment, organic materials, e.g., the polyolefin fibers or fabrics found in the composites, can be oxidized, so as to better bond with resins that can be used as bonding agents. For instance, the materials can be oxidized via a plasma treatment method.

The composite structures of the invention can exhibit excellent characteristics. For example, the composite structures can have a low average density, such as less than about 1.5 g/cm$^3$. Moreover, the composites can have a low density in combination with high strength characteristics, such as a flexural strength greater than about 80 MPa and/or a flexural modulus greater than about 3 GPa. In addition, the composite structures can have a low dielectric constant, for instance less than about 3.5 in some embodiments, or lower yet in other embodiments, for example, less than about 2.7. As such, the composite materials can be essentially transparent to electromagnetic waves.

The composite materials can be advantageously utilized in many applications including, for example, in forming circuit boards, radomes, and boat or automobile parts. For instance, the disclosed materials can be utilized in forming radomes or similar structures useful for housing and protecting electromagnetic transmitters and/or receivers for use in weather tracking, aircraft monitoring, or the like. In another embodiment, the low loss composite materials can be used in forming circuit boards, and in one particular embodiment, high frequency circuit boards, i.e., those operating at frequencies greater than about 100 KHz.

BRIEF DESCRIPTION OF THE FIGURES

A full and enabling disclosure of the present invention, including the best mode thereof, to one of ordinary skill in the art, is set forth more particularly in the remainder of the specification, including reference to the accompanying Figures in which.

Figure 1:
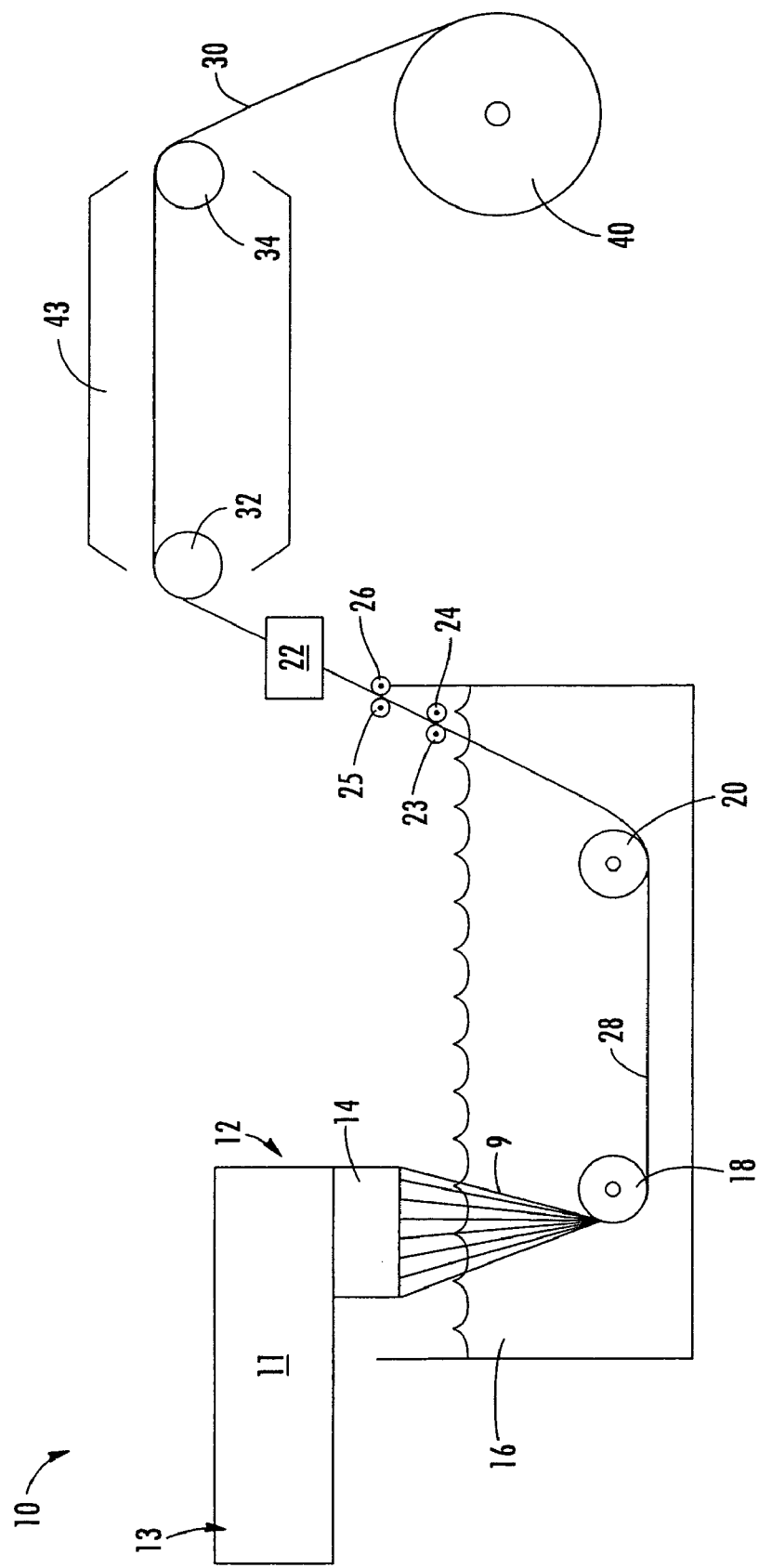
FIG. 1 is a schematic representation of one exemplary method for forming high modulus polyolefin fibers suitable for use in the disclosed composite structures.

Repeat use of reference characters in the present specification and drawings is intended to represent the same or analogous features or elements of the present invention.

DETAILED DESCRIPTION OF THE INVENTION

Reference will now be made in detail to various embodiments of the invention, one or more examples of which are set forth below. Each embodiment is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used in another embodiment to yield a still further embodiment. Thus, it is intended that the present invention cover such modifications and variations as come within the scope of the appended claims and their equivalents.

In general, the present invention is directed to composite materials incorporating at least one layer including high modulus semi-crystalline polyolefin fibers as well as to methods for forming the disclosed composite materials and methods for using the disclosed materials. In one embodiment, the composite materials can exhibit improved characteristics as compared to previously known composite materials. For instance, the disclosed materials can exhibit high flexural strength and high flexural modulus while describing a lower density than previously known composites having similar strength characteristics. In addition, the disclosed composite materials can match or exceed the engineering specifications of previously known composites while being less expensive to produce.

The semi-crystalline polyolefins used in forming one or more individual layers of the disclosed composites can have a low dielectric constant as well as a low dielectric loss. For example, the dielectric constant of the composite could be below about 4.0, or below about 3.5, or even below about 3.0 in some embodiments. As such, in one embodiment, the disclosed composite materials can be essentially transparent to electromagnetic waves and can be beneficially utilized in electrical applications, for example in forming reasonably priced circuit board substrates suitable for high frequency electrical applications or for use as radomes or other protective enclosures or coverings of electrical circuitry.

In one particular embodiment, the semi-crystalline polyolefin can be a semi-crystalline polypropylene. This is not a requirement of the present invention, however, and though the ensuing discussion is generally directed toward polypropylene, it should be understood that other polyolefins can optionally be utilized in the invention. For example, in one embodiment, the disclosed invention can be directed to composite materials including one or more high modulus polyethylene or polybutylene fibers.

For purposes of this disclosure, the terms 'semi-crystalline polypropylene' and 'polypropylene' are intended to be synonymous and include any semi-crystalline polymeric composition comprising propylene monomers, either alone (i.e., homopolymer) or as a copolymer with other polyolefins, dienes, or other monomers (such as ethylene, butylene, and the like). Moreover, while in some embodiments, the high modulus fibers can be formed with one or more polypropylene homopolymers and/or copolymers as the only polymeric component of the fiber, in other embodiments, the polypropylene formations of the invention can include other polymers and thus the composite materials can encompass high modulus polyolefin fibers formed from polypropylene blends, for example polypropylene/polyethylene blends. The term is also intended to encompass any different configuration and arrangement of the constituent monomers (such as syndiotactic, isotactic, and the like). Thus, the term as applied to fibers is intended to encompass actual strands, tapes, threads, and the like, of a semi-crystalline polymer including polymerized propylene monomers.

In addition, the semi-crystalline polypropylenes of the invention can be formed of any standard melt flow. For example, in one embodiment, standard extrusion grade polypropylene resin possessing ranges of melt flow indices (MFI) between about 0.2 and about 50 can be utilized. In one embodiment, polypropylene possessing an MFI between about 0.5 and about 25 can be utilized. In one embodiment, the polypropylene utilized in forming the multi-filament yarn can have an MFI between about 1 and about 15.

For purposes of this disclosure, the term fiber is intended to encompass a structure that exhibits a length that exceeds the largest cross-sectional dimension (such as, for example, the diameter for round fibers). Thus, the term fiber as utilized herein differs from other structures such as plaques, containers, sheets, films and the like that can be extruded, blow-molded or injection molded. The term does encompass, however, structures including monofilament fibers, multi-filament fibers, yarns, tape fibers, and the like.

The term multi-filament yarn is intended to encompass a structure that includes at least three filaments that have been individually formed such as via extrusion through a spinneret prior to being brought in proximity to one another to form a single yarn structure that can then be incorporated into a fabric.

High modulus fibers suitable for use in the present invention can generally have a modulus as measured according to ASTM D2256-02, which is incorporated herein by reference, greater than about 8 GPa (100 grams/denier). In one embodiment, the fibers can have a modulus greater than about 10 GPa, for example, greater than about 12 GPa, or greater than about 16 GPa. In addition, the fibers of the present invention can have a high tenacity, for example greater than about 400 MPa (5 grams/denier) in some embodiments as measured according to ASTM D2256-02. In one embodiment, the fibers can have a tenacity greater than about 500 MPa, or greater yet, greater than about 560 MPa (7 grams/denier). The fibers can also have a low density, for example, less than about 1.3 g/cm$^3$, in one embodiment. In another embodiment, the fibers can have a lower density, for instance less than about 1.0 g/cm$^3$ In one embodiment, multi-filament yarns formed from a melt according to the methods disclosed in co-owned U.S. patent application having Ser. No. 10/983,153 to Morin, now U.S. Pat. No. 7,074,483, which is incorporated herein by reference, can be utilized in forming the disclosed composite materials.

One embodiment of a process for forming high modulus polyolefin fibers suitable for use in the present invention is schematically illustrated in FIG. 1.

According to this embodiment, a polymeric composition can be provided to the extruder apparatus 12. The polymeric composition can include one or more polymeric components as well as any desired additives as are generally known in the art. For example, the mixture can include suitable coloring agents, such as dyes or other pigments. Other additives that can be combined with the mixture can include, for example, one or more of anti-static agents, antioxidant agents, antimicrobial agents, adhesion agents, stabilizers, plasticizers, brightening compounds, clarifying agents, ultraviolet light stabilizing agents, nucleating agents, surface active agents, odor enhancing or preventative agents, light scattering agents, halogen scavengers, and the like. In addition, additives can be included in the melt or can be applied as a surface treatment to either the undrawn formation or optionally to the drawn material.

In one embodiment, an additive can be included that can leave reactive groups on the surface of the extrusion product. Reactive groups can be added to improve the adhesion of the polypropylene to other materials utilized in forming the composite structures. For example, maleic anhydride can be included in the melt, leaving groups on the surface of the fibers suitable for reacting with unsaturated polyester resins, among others. These groups can then be available to bond with secondary materials, such as bonding agents for instance, and improve adhesion between the different materials forming the composites.

In one embodiment, the extruder apparatus 12 can be any melt spinning apparatus as is generally known in the art. For example, the extruder apparatus 12 can include a mixing manifold 11 in which a polymeric composition can be combined, mixed and heated to form a molten composition. The mixture can then be conveyed under pressure to the spinneret 14 where it can be extruded at a high temperature through multiple spinneret orifices to form multiple filaments 9. According to one embodiment, the polymer can be extruded through the spinneret at a relatively high throughput and low spinline tension. For example, the polymer can be extruded through the spinneret at a throughput of not less than about 50% of that required to give melt fracture. Specific melt fracture throughput values for any particular system and materials as well as methods of obtaining such are generally known to those of skill in the art, and thus a detailed discussion of this phenomenon is not included herein.

Following extrusion of the polymer, the un-drawn filaments 9 can be quenched in a liquid bath 16 and collected by a take-up roll 18 to form a multi-filament fiber structure or fiber bundle 28. In one embodiment, the bath 16 can be heated. For example, the bath can be heated to a temperature near the maximum crystallization temperature ($T_c$) of the polymer. In addition, the surface of the bath can be located close to the spinneret 14. For instance, the surface of the bath 16 can be at a distance from the spinneret 14 such that an extruded filament 9 can enter the bath 16 within the distance of the die swell of the filament 9. Optionally, the individual filaments 9 can pass through a heated or a non-heated shroud prior to entering the bath 16. Take-up roll 18 and roll 20 can be within bath 16 and convey individual filaments 9 and fiber bundle 28 through the bath 16.

At or near the location where the fiber bundle 28 exits the bath 16, excess liquid can be removed from the fiber bundle 28. This step can generally be accomplished according to any process known in the art. For example, in the embodiment illustrated in FIG. 1, the fiber bundle 28 can pass through a series of nip rolls 23, 24, 25, and 26 to remove excess liquid from the fiber bundle. Other methods can be alternatively utilized, however. For example, in other embodiments, excess liquid can be removed from the fiber bundle 28 through utilization of a vacuum, a press process utilizing a squeegee, one or more air knives, and the like.

In one embodiment, a lubricant can be applied to the fiber bundle 28. For example, a spin finish can be applied at a spin finish applicator chest 22, as is generally known in the art. Any suitable lubricant can be applied to the fiber bundle 28. For example, a suitable oil-based finish such as Lurol PP-912, available from Ghoulston Technologies, Inc. can be applied to the fiber bundle 28. Addition of a finishing or lubricant coat can improve handling of the fiber bundle during subsequent processing and can also reduce friction and static electricity build-up on the finished yarn. In addition, a finish coat on the yarn can improve slip between individual filaments of the yarn during the drawing process and can increase the attainable draw ratio, and thus increase the modulus and tenacity of the drawn multi-filament yarn.

After quenching of the fiber bundle 28 and any optional process steps, the fiber bundle can be drawn while applying heat. For example, in one embodiment the fiber bundle 28 can be drawn in an oven 43 heated to a temperature of between about 80° C. and about 170° C. In particular, the fiber bundle 28 can be drawn with a draw ratio (defined as the ratio of the speed of the second or final draw roll 34 to the first draw roll 32) of greater than about 6. In one embodiment, the draw ratio of the first (or only) draw can be between about 6 and about 25. In another embodiment, the draw ratio can be greater than about 10, for instance, greater than about 15. Additionally, the yarn can be wrapped on the rolls 32, 34 as is generally known in the art. For example, in one embodiment, between about 5 and about 15 wraps of the yarn can be placed on the draw rolls.

While the illustrated embodiment utilizes a series of draw rolls for purposes of drawing the yarn, it should be understood that any suitable process that can place a force on the yarn so as to elongate the yarn following the quenching step can optionally be utilized. For example, any mechanical apparatus including nip rolls, godet rolls, steam cans, air, steam, or other gaseous jets can optionally be utilized to draw the yarn. Following the yarn drawing step, the multi-filament yarn 30 can be cooled and wound on a take-up roll 40.

In one embodiment, the finished multi-filament yarn 30 can be wound on a spool or take-up reel 40, as shown, and transported to a second location for formation of the composite materials of the present invention. In an alternative embodiment, the multi-filament yarn can be fed directly to a second processing line, where the yarn can be further processed.

The invention is not limited to high modulus multi-filament fibers formed according to the above-described process. For example, in another embodiment, one or more layers of the disclosed composite structures can incorporate high modulus polyolefin fibers formed from an extruded film. For example, a high modulus melt processed film such as that described in U.S. Pat. No. 6,110,588 to Perez. et al., which is incorporated herein by reference, can be utilized in forming fibers and fibrous webs for the disclosed composite structures.

In one embodiment, a highly oriented, semi-crystalline, melt processed film can first be formed with an induced crystallinity. An induced crystallinity higher than that normally attainable in a melt processed film can be obtained by a combination of casting and subsequent processing such as calendaring, annealing, stretching, and/or recrystallization. Following formation of the film, the film can be further processed to form the fibers and fabrics for use in the composite structures of the invention.

Figure 2:
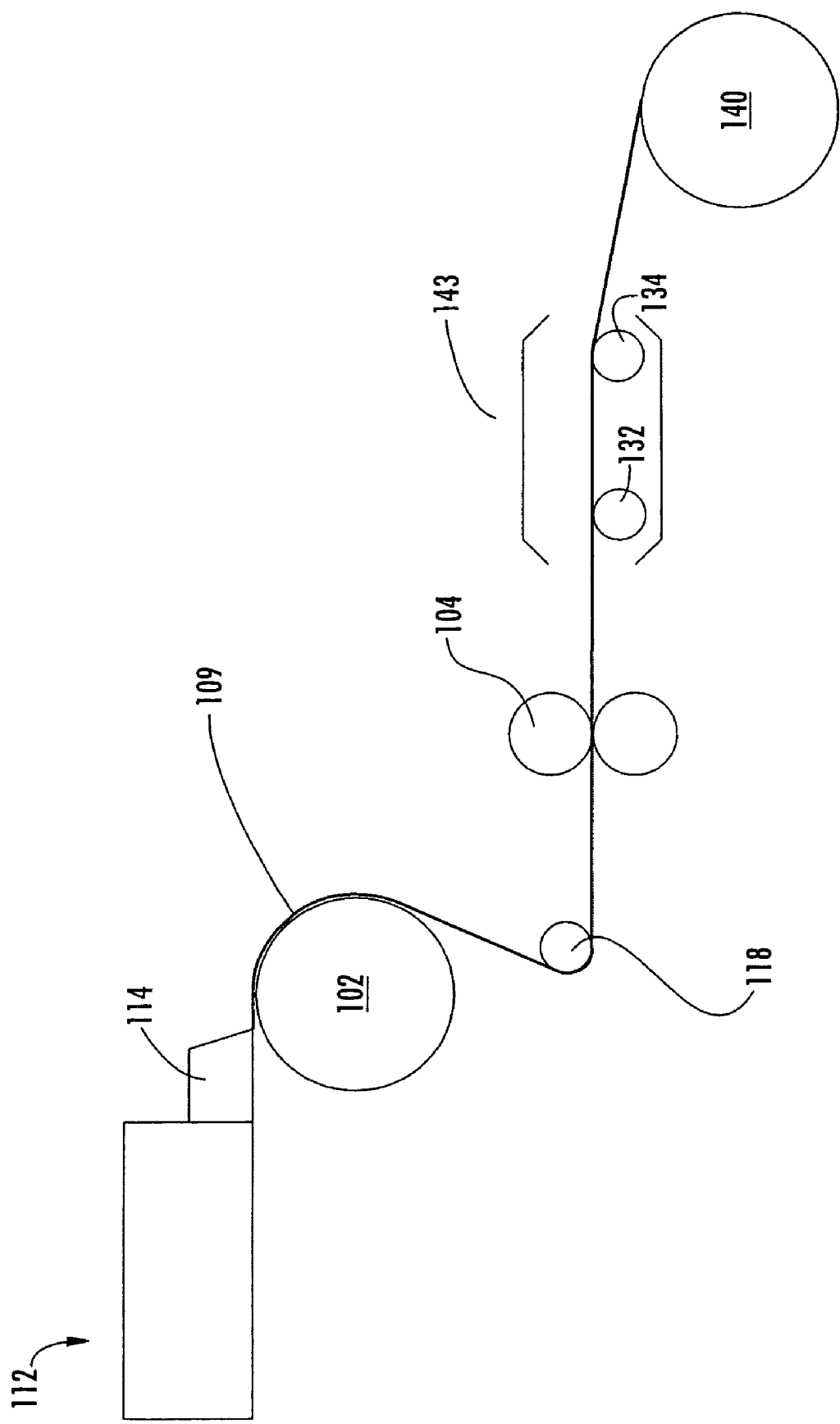
FIG. 2 is a schematic representation of another exemplary method for forming high modulus polyolefin fibers suitable for use in the disclosed composite structures.

One embodiment for forming a high modulus melt-extruded polyolefin film is schematically illustrated in FIG. 2. As can be seen, according to this embodiment, a polymeric composition can be provided to the extruder apparatus 112, and can be extruded through a die 114 in the form of a film or sheet 109. The thickness of the film 109 can generally be chosen according to the desired end use and can be achieved by control of the process conditions. For example, the cast film 109 can have a thickness in one embodiment of less than 100 mils (2.5 mm). In one embodiment, the film 109 can have a thickness between 30 and 70 mils (0.8 to 1.8 mm). However, depending on the characteristics desired for the fibers that will be formed from the film, the film 109 can optionally be cast at thicknesses outside of this range.

Following extrusion, the film 114 can be quenched on a heated casting drum 102, the surface of which can be maintained at a temperature above the glass transition temperature, but below the melt temperature of the polymeric composition. Quenching on a heated casting drum is not a requirement of this particular embodiment, however, and in other embodiments, the film may be quenched in air or in a fluid such as water, which may be heated, as in the multi-filament fiber formation process described above.

In another embodiment, the film may be rapidly quenched to a temperature below the crystallization temperature and the crystallinity then increased by stress-induced crystallization; for example by drawing at a draw ratio of at least 2:1.

After casting (and drawing, if any), the film 109 can be calendered, as at 104. Calendering can allow higher molecular orientation to be achieved and enable subsequent higher draw ratios. In one embodiment, calendaring can be performed at or above the alpha crystallization temperature. The alpha crystallization temperature is herein described as the temperature at which crystallite subunits are capable of being moved within the larger lamellar crystal unit.

After calendering, the film 109 can be drawn under conditions of plastic flow that are below those at which catastrophic failure of the film could take place. When considering polypropylene, the films may be drawn to a length of at least about 5 times the extruded length. In one embodiment, when considering both the calendering and drawing steps, the combined draw ratio can be at least 10:1. In one embodiment, the combined draw ratio for a polypropylene film can be between about 10:1 and about 40:1.

As with the multi-filament fiber forming process discussed above, a draw can be performed at an elevated temperature, for instance in an oven 143, using heated draw rolls, or the like. In addition, the draw step can utilize two draw rolls, 132, 134, as illustrated, or optionally multiple draw rolls as well as any other suitable drawing method.

Following the draw step, the highly oriented film 109 can be collected on a roll 140 for additional processing or optionally immediately sent to a second line for additional processing. The final thickness of the film can generally be determined by combination of the casting thickness, the calendering thickness and the draw ratio. In one embodiment, the final thickness of the film can be between about 1 and about 20 mils (about 0.025 to about 0.5 mm). In another embodiment, the film thickness can be between about 3 and about 10 mils (about 0.075 to about 0.25 mm).

Following formation of the highly oriented, highly crystalline film, the film can be further processed to form high modulus fibers for use in the disclosed composite structures. For example, in one embodiment, the film can be sliced or cut according to methods as are generally known in the art so as to form a plurality of high modulus tape fibers.

In another embodiment, the film can be fibrillated and/or micro-fibrillated to release macro-fibers and/or micro-fibers from the film. For instance, in one embodiment, the film may be subjected to a fibrillation step using conventional mechanical means to release macroscopic fibers from the highly oriented film. One exemplary means of mechanical fibrillation uses a rotating drum or roller having cutting elements such as needles or teeth that can contact the film as it moves past the drum. The teeth may fully or partially penetrate the surface of the film to impart a fibrillated surface thereto. Other similar macro-fibrillating treatments are known and include such mechanical actions as twisting, brushing (as with a porcupine roller), rubbing, for example with leather pads, and flexing. The fibers obtained by such conventional fibrillation processes can be macroscopic in size, are generally several hundreds of microns in cross section, and may be either semi-detached or completely detached from the film.

Optionally, the oriented film can be micro-fibrillated by imparting sufficient fluid energy thereto to release micro-fibers from the film. For example, one or both surfaces of the film can be contacted with a high-pressure fluid via, for instance, a multitude of fluid jets. Any type of liquid or gaseous fluid may be used. Liquid fluids may include water or organic solvents such as ethanol or methanol. Suitable gases such as nitrogen, air or carbon dioxide may be used, as well as mixtures of liquids or mixtures of gases. Any such fluid is preferably one that is not substantially absorbed by the polymer matrix as that could reduce the orientation and degree of crystallinity of the micro-fibers. In another embodiment, the micro-fibrillation may be conducted by immersing the film in a high-energy cavitating medium. For instance, by applying ultrasonic energy to the fluid in which the film is immersed.

Micro-fibrils formed according to such a process are generally several orders of magnitude smaller in diameter than the fibers obtained by mechanical means and can range in size from less than about 0.01 microns to about 20 microns.

When utilizing a micro-fibrillation process, many if not all of the micro-fibers can stay attached to the film. Advantageously the micro-fibrillated article, including the micro-fibers semi-detached from the film, can provide a convenient and safe means of handling, storing and transporting the micro-fibers. If desired, the micro-fibers may be harvested from the surface of the film by mechanical means such as with a porcupine roll, scraping and the like and then utilized in forming the disclosed composite structures. Optionally, however, the web including a plurality of semi-detached micro- and/or macro-fibers can be used as is in the composite structures. In particular, the web including a plurality of high modulus micro- and/or macro-fibers can form a nonwoven web for inclusion as a single layer in the disclosed composite structures.

Figure 3:
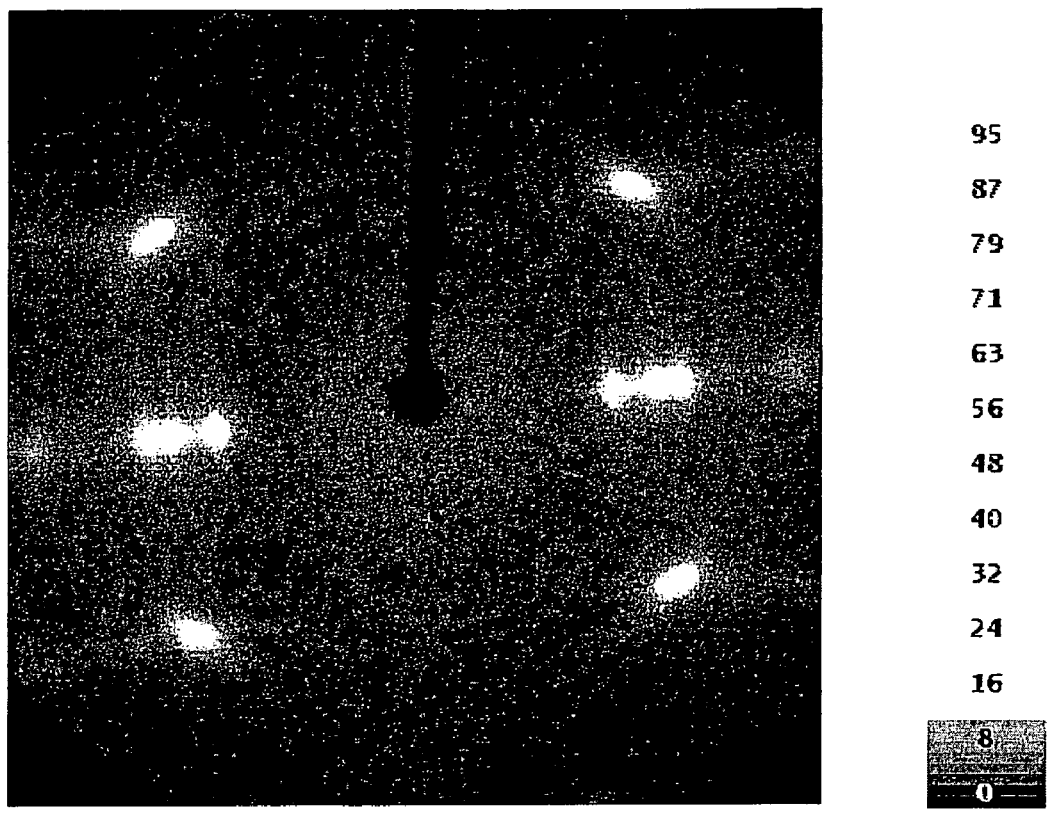
FIG. 3 is the WAXS scattering pattern of a polypropylene filament suitable for use in the present invention.

When considering high modulus polypropylene fibers formed according to a melt extrusion process, such as that illustrated in FIGS. 1 and 2, the fibers can be highly crystalline and highly oriented, with little or no lamellar structure. In particular, the individual fibers (e.g., individual filaments of a multi-filament yarn) can possess greater than about 80% crystallinity according to WAXS measuring techniques. For example, FIG. 3 illustrates the WAXS scattering pattern of an exemplary high modulus polypropylene fiber of the disclosed composites formed from a melt. This particular fiber was pulled from a yarn that was formed from a melt via extrusion through a spinneret with eight orifices of 0.012 inches diameter each, quenched in a water bath at 73° C., and drawn at a draw ratio of 16.2. The drawn yarn had a final denier of 406 grams/9000 m. As can be seen with reference to the Figure, where 0φ is parallel to the fiber, the amorphous region of the fiber can be 2θ from 10 to 30 and φ from 60 to 90 (the dark region near bottom of FIG. 3), and the crystalline region can be 2θ from 10 to 30 and φ from −15 to 15 (including bright spots on the sides of FIG. 3). Thus by integrating the x-ray scattering intensity in the crystalline and amorphous regions, the crystallinity of the filament can be obtained as $$\frac{(I_X - I_A)}{(I_X)}$$

where: $I_X$ is the intensity in the crystalline region and $I_A$ is the intensity in the amorphous region.

In addition, the polyolefin fibers can be highly oriented, as shown by the narrow width of the WAXS peaks in FIG. 3.

Figure 4:
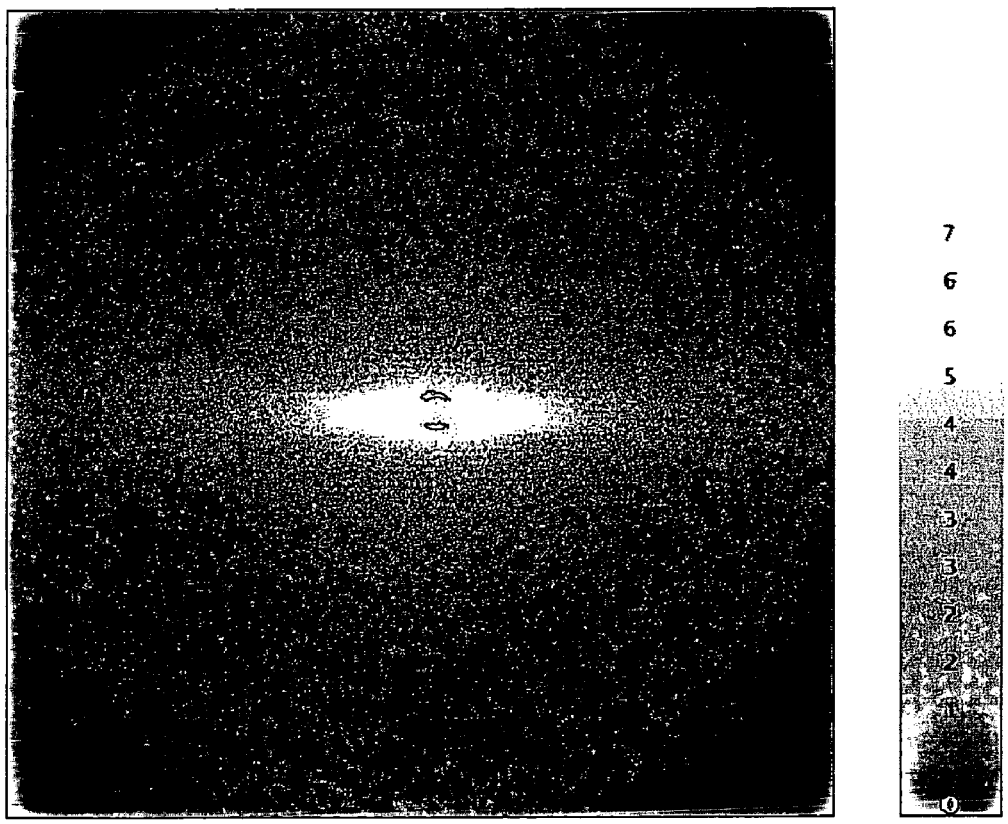
FIG. 4 is the SAXS scattering pattern of the polypropylene filament of FIG. 3.
Figure 5:
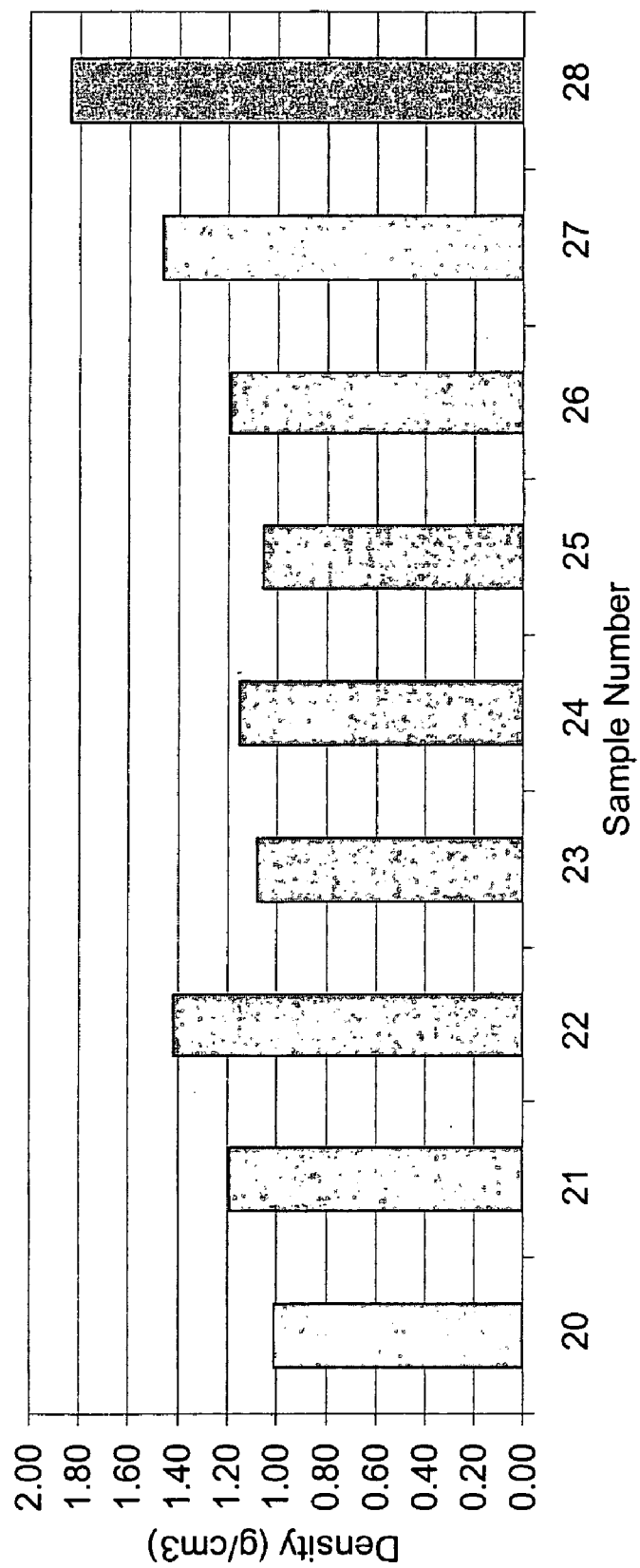
FIGS. 5-8 graphically illustrate physical and electrical characteristics of exemplary composite structures of the present invention.
Figure 6:
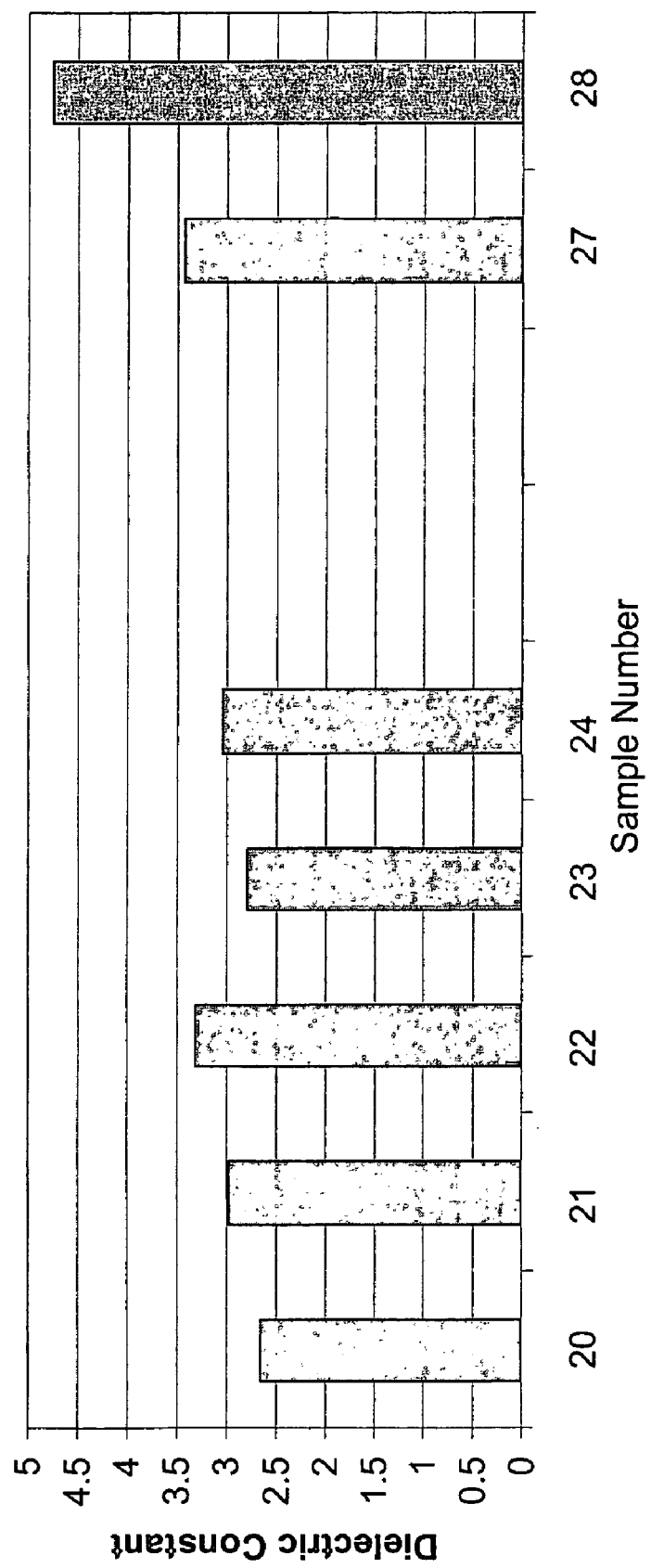
Figure 7:
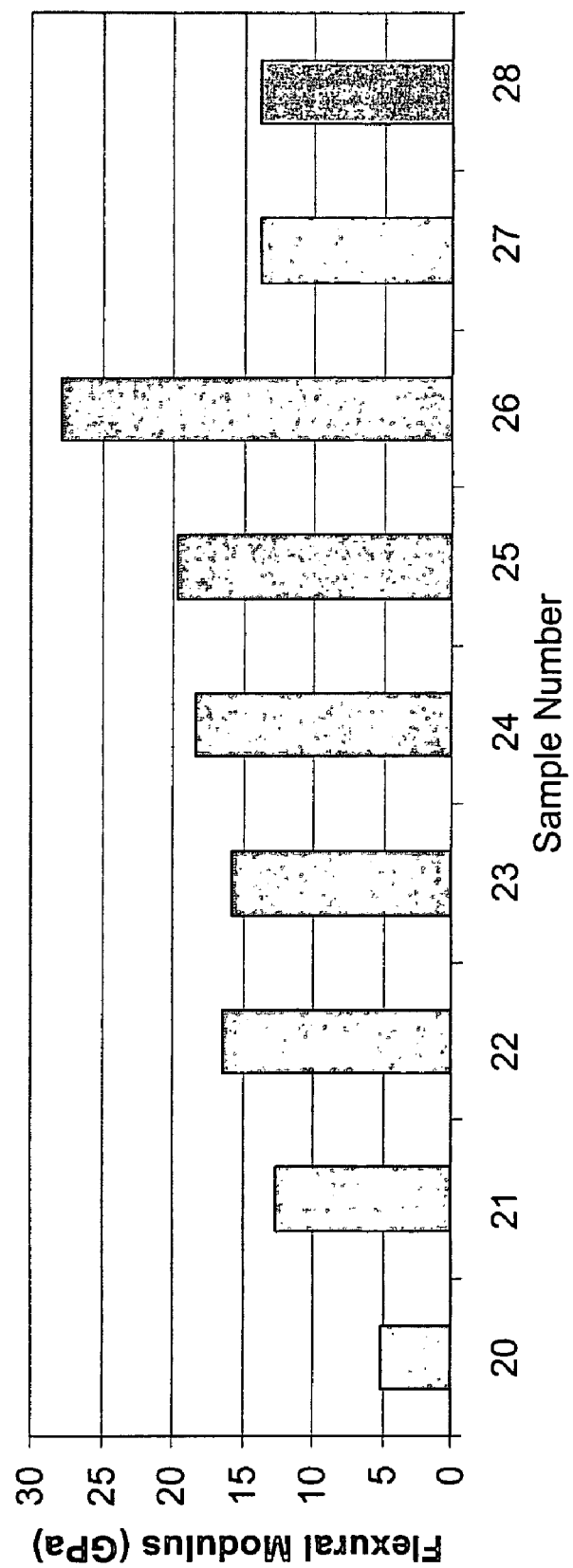
Figure 8:
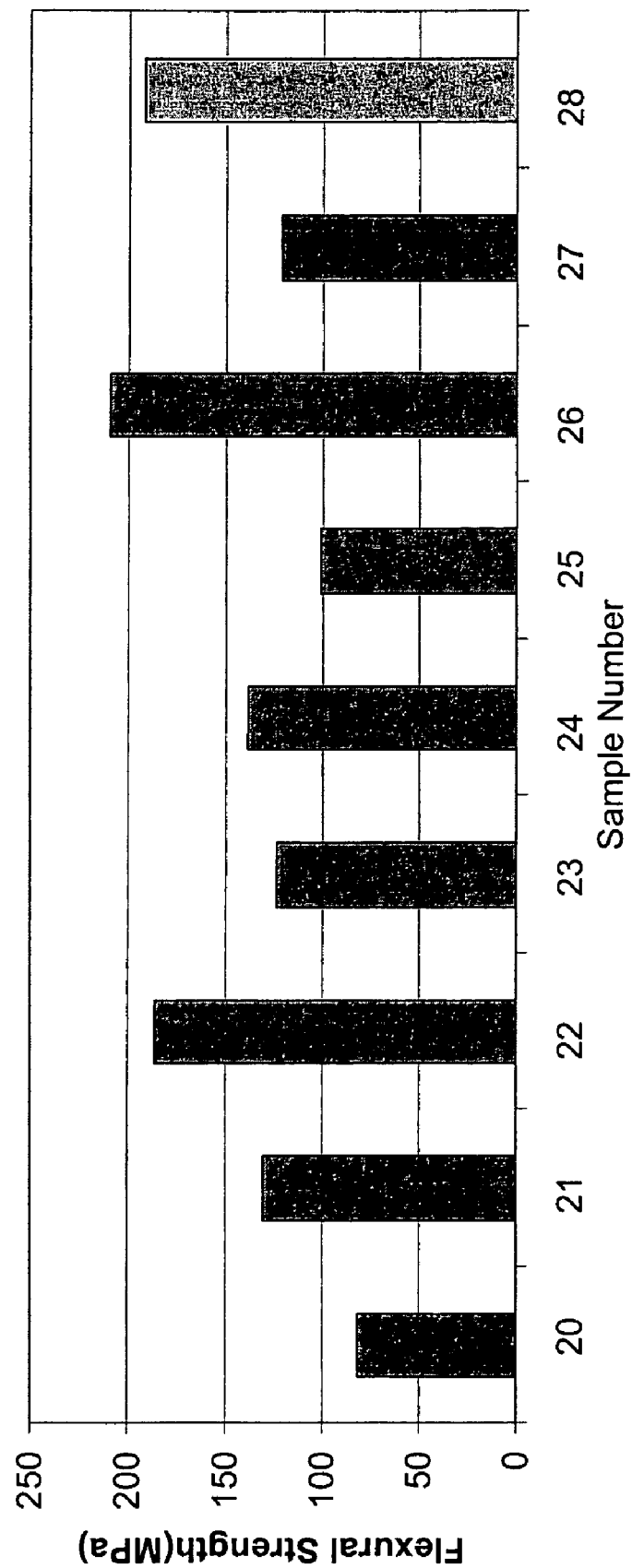

FIG. 4 is the SAXS pattern of the filament shown in FIG. 3. As can be seen, none of the expected structures relating to the crystalline form, orientation, and amorphous regions appear in the Figure, and the fiber appears to have no true amorphous regions at all, but appears to be composed entirely of crystalline regions and highly oriented amorphous regions.

SAXS patterns of lower modulus polyolefin fibers generally include alternating crystalline and amorphous regions that appears as bright spots of scattering intensity in the yarn axis. (See, for example, *Polypropylene Fibers—Science and Technology*, M. Ahmed, Elsevier Scientific Publishing Company, 1982, pp. 192-203, which is incorporated herein by reference.) The positions of these spots can be utilized to obtain the long period spacing between repeating crystalline regions. The absence of these spots in FIG. 4 indicates that any amorphous regions in the fiber of FIG. 4 have nearly identical electron density to the crystalline regions, and are thus composed of dense, highly oriented amorphous chains, or are absent altogether. When combined with the WAXS pattern of FIG. 3, which indicates that the amorphous intensity is at least 15%, it may be assumed that amorphous regions of the illustrated filament most likely consists of the highly oriented chains.

In addition, the equatorial scattering in SAXS patterns in general arises from the center normal to the fiber axis and projects in a long, thin streak away from the center in each direction. In the illustrated fiber, and in further reference to FIG. 4, these equatorial scattering streaks have amplified greatly, to the point that they are more aptly described as "wings." This equatorial scattering arises from fibrillation of the crystalline segments into more clearly defined needle-like assemblies. A long equatorial streak arises from a high concentration of cylindrical, shish-type structures in the yarn with the lamellae organized among or around the shishes, as "kabobs." These streaks generally appear in higher draw situations such as those of the present invention.

As can also be seen in FIG. 4, the filaments can describe a nearly absent meridonal reflection and an equatorial scattering that is strong such that the scattering ratio of equatorial to meridional scattering intensity is high, but there remains strong density contrast as indicated by the overall intensity.

In general, the high modulus fibers suitable for use in forming the disclosed composite materials can have SAXS characteristics including a ratio of equatorial intensity to meridonal intensity of greater than about 1.0. In one embodiment, this ratio can be greater than about 3. The fibers can generally exhibit an equatorial intensity integrated from 2θ of between about 0.4 to about 1.0 and φ from about 60 to about 120 and from about 240 to about 300 (zero φ being parallel to the yarn, or vertical in reference to FIG. 4). In addition, the fibers can exhibit a meridonal intensity integrated from 2θ of between about 0.4 and about 1.0 and φ from about −60 to about 60 and from about 120 to about 240.

In another embodiment, one or more layers of the composite structures can include high modulus polyolefin fibers formed according to a solution spinning process, as is generally known in the art. For example, layers of the composite can incorporate high modulus polyolefin fibers formed according to the exemplary solution spinning processes as described in U.S. Pat. No. 4,413,110 to Kavesh, et al., U.S. Pat. No. 4,137,394 to Meihuizen, et al., or U.S. Pat. No. 5,958,582 to Dunbar, et al., all of which are incorporated herein by reference.

According to the present invention, composite, multi-layer structures are disclosed that include a plurality of high modulus, high tenacity polypropylene fibers in at least one layer. The disclosed composites also include a second layer that can be the same as or different from the first layer, and a polymeric binding agent. It has been discovered that due to the unique and beneficial characteristics of high strength polyolefin fibers, and in particular, those exhibiting high modulus and high tenacity in combination with low density and low dielectric constant, these materials can be beneficially combined with a suitable polymeric binding agent according to any suitable combinatorial process and optionally in conjunction with layers formed of other materials to form the composite materials of the present invention.

According to the invention, one or more layers of the disclosed composites can be a woven, nonwoven, or knit fabric incorporating the high modulus polyolefin fibers. The term 'fabric' is herein defined to encompass any planar textile structure produced by the interlacing of yarns, multi-filament fibers, monofilament fibers, or some combination thereof. Accordingly, one or more layers of the disclosed composite materials can include the high modulus polyolefin fibers in a predetermined, organized, and interlaced pattern, herein referred to as a weave fabric (i.e., a fabric formed according to a weaving and/or knitting process), or optionally can include the fibers in a random pattern (a nonwoven fabric), or in a unidirectional prepreg fabric, in which multiple unidirectional fibers are aligned and held in a matrix of a polymeric binding agent.

A weave fabric of the disclosed composite structures can be formed according to any textile formation process and utilizing any weaving and/or knitting textile formation systems and devices as are generally known in the art suitable for use with a polyolefin-containing fibers, such as those described herein. For example, for inclusion in a thin circuit board material, the fabric could be made from a small yarn, about 40 denier, and included in a weave structure of up to 100 picks per inch in either or both directions. For larger structures, the fabric could be composed of a larger yarn, up to about 10,000 denier or even higher, and woven in a structure with only 10 or even fewer picks per inch. In this way, composites of varying thicknesses and physical properties can be prepared. In addition, any weave pattern which allows the strength of the yarn to be transferred into the resin component is acceptable. For example, weave patterns such as twill and satin that are well known in the art can be utilized along or in combination in the disclosed structures.

A nonwoven fabric incorporating the high modulus polyolefin fibers can be formed according to any suitable formation process as in generally known in the art. For example, following formation, a plurality of fibers including the disclosed high modulus polyolefin fibers can be randomly laid on a traveling formation fabric according to any known process and bound to one another utilizing an adhesive, applied heat, applied pressure, or some combination thereof. Suitable adhesives are generally known in the art and can be applied during the fiber formation process or during the web-formation process, as desired. In one embodiment, a nonwoven fabric can include a plurality of macro- and/or micro-fibers partially and/or completely released from a high crystalline polyolefin film.

In one embodiment, a layer for inclusion in the disclosed composites can be formed entirely of the high modulus, high tenacity polypropylene fibers. For instance, both the pick and warp yarns of a weave fabric layer can be exclusively high modulus polypropylene yarns. Optionally, however, the composite structures of the invention can include other materials, in addition to the high modulus polypropylene fibers and a polymeric binding agent. For example, in one embodiment, the composite structure can include one or more layers including high modulus polypropylene fibers, and this layer can itself be a composite material.

For instance, in one embodiment, a layer of the composite can include high modulus polypropylene fibers as a component of a composite yarn. A composite yarn is herein defined to encompass a yarn formed from the combination of two different fiber types. For example, a high modulus polypropylene fiber can be combined with a fiber of a different material such as, but not limited to, glass fibers, carbon fibers, metal fibers or fibers formed of other polymers such as, for instance, high performance polyolefins such as ultra high molecular weight polyethylene (UHMWPE), fluororcarbon-based fibers such as polytetrafluoroethylene (PTFE), or polyaramids such as poly-paraphenylene terephthalamide to form a composite yarn.

Exemplary composite fibers can be formed according to any suitable composite fiber-forming process. For example, two or more fibers can be combined via twisting, false twist texturing, air texturing, or any other yarn texturing or combining process. In one embodiment, a composite yarn can be formed including an inner core formed of a first material and an outer wrapping comprising a different material, and in one particular embodiment, a high modulus polypropylene fiber as herein described. One exemplary method for forming such composite yarns has been described in U.S. Pat. No. 6,701,703 to Patrick, which is incorporated herein by reference. In another embodiment, a composite yarn can be formed according to an air-jet combinatorial method, such as that described in U.S. Pat. No. 6,440,558 to Klaus, et al., which is also incorporated herein by reference. These are merely exemplary methods, however, and multiple such suitable combinatorial processes are well known to one of ordinary skill in the art, and thus are not described at length herein.

In one composite yarn embodiment, the composite yarn can include two or more polyolefin fibers having melt temperatures that differ by a significant amount. For example, one exemplary composite yarn can include a high modulus polypropylene yarn that has a melt temperature of about 165° C. combined with a polyethylene yarn that has a melt temperature of about 135° C. According to this particular embodiment, woven fabrics including the composite yarn, can be compressed with other layers under heat and pressure sufficient to melt the lower melting constituent and it can act as the aforementioned polymeric binding material providing a polymeric matrix reinforced by the high modulus polypropylene yarn as a layer in the composite structure. For the low melting temperature component, multiple polymers or mixtures of polymers which have an appropriately low melting temperature are possible and well known to those of ordinary skill in the art, and thus need not be described in detail herein.

In another embodiment, one or more layers of the composite structure can be a composite fabric that can include a mixture of fiber or yarn types in the fabric. For example, a weave fabric can be formed including high modulus polypropylene yarns or composites thereof in combination with yarns or fibers of different materials, such as, for example, materials such as those discussed above in reference to forming composite yarns. For example, a fabric can be formed including a plurality of high modulus polypropylene yarns in combination with glass fibers, carbon fibers, aramid fibers, composite fibers, or the like that can be included intermittently throughout the weave.

According to this particular embodiment, the size, total number, direction, and location of the secondary fibers in the fabric can be controlled to help define the specific characteristics of the fabric layer. For example, the composite structure can include one or more individual weave fabric layers that are anisotropic with respect to flexural and/or tensile strength characteristics that can be controlled through addition of secondary fibers at predetermined locations in the pick and/or warp of the fabric.

In addition to one or more layers incorporating a plurality of high modulus polypropylene fibers, the composite structures of the disclosed invention can also include one or more additional layers that need not necessarily include any high modulus polypropylene fibers. A non-limiting list of materials that can be beneficially included as one or more layers of the disclosed composite structures can include, for example, fiberglass woven and nonwoven fabrics; carbon fiber wovens and nonwovens; polymeric woven, nonwovens, films, sheets, and the like that can include any of a variety of polymeric fibers, polymeric matrices, or some combination thereof, including, for instance, fiber-reinforced thermoset matrices formed with halogenated polymers (e.g., PTFE, PVC, PVA, etc.), polyaramids (e.g., Kevlar®), UHMWPE, and the like; metal films and foils; and/or liquid crystal materials.

These additional layers can add desirable physical characteristics to the composite structure such as tensile strength, flexural strength, or cross-direction permeation strength. For instance the, composite structure can include one or more materials that can increase resistance of the layered structure to perforation or infiltration by a foreign substance (e.g., projectiles, liquid permeation, and the like) in the cross-direction.

In one embodiment, one or more layers of the composite can enhance particular electrical characteristics of the structure. For example, the composite structure can include a layer of an electrically insulating dielectric material upon which a metal can be applied, for instance in the formation of a circuit pattern on an electrical device.

Any layer of the disclosed composite structures can optionally be continuous or discontinuous across the entire structure. For instance, in the particular example of a composite structure for use in an electrical device, one or more layers of the composite structure can include conductive materials arranged in a particular pattern so as to form an electric circuit on the structure. As herein defined, the patterned formation of materials such as conductive materials can be considered a single layer of the disclosed composite structures, though the formation may be discontinuous across the surface of an adjacent layer of the structure. For example, multiple layers of composite material can each be patterned with electrical conducting materials to form a circuit, and then these layers combined to form a multi-layer electrical circuit board as is well known in the art.

Prior to combining multiple individual layers of the disclosed composite structures, it can be beneficial in certain embodiments to pre-treat one or more of the materials of the composite. For example, in one embodiment, either a fiber or a formed layer can be pre-treated to improve certain characteristics of the fiber or layer, such as wettability or adhesion, for example. For instance, a fiber can be fibrillated, subjected to plasma or corona treatments, or can be treated with a surface sizing, all of which are generally known in the art, to improve or enhance the physical characteristics. In one embodiment, the fibers or layer can be treated to increase the surface area of the material, for instance via a fibrillation process, so as to increase the area available for subsequent binding agent application and thus improve adhesion to adjacent layers. For example, fibers, films, or fabrics can be fibrillated or micro-fibrillated according to methods described above or similar such methods as are generally known in the art to improve inter- and intra-layer adhesion.

In another embodiment, it can be beneficial to surface functionalize the materials forming one or more layers so as to promote formation of a stronger bond between the layers during the composite formation process. In such embodiments, functionalization may be obtained according to any suitable method. For example, a fiber sizing can be coated onto the individual fibers prior to forming a fabric layer or optionally onto the fabric itself. A suitable sizing can include any sizing that is capable of bonding to the fiber surface while leaving reactive groups for bonding to a matrix resin or for bonding directly to another layer of the composite.

In one particular embodiment, organic materials to be included in the composite structure, and in particular the high modulus polypropylene fibers or layer formed thereof can be oxidized prior to combining individual layers one to another, so as to promote better bonding of the layers. For example, high modulus polypropylene fibers can be oxidized either before or after a fabric forming process according to any suitable oxidation method including, but not limited to, corona discharge, chemical oxidation, flame treatment, oxygen plasma treatment, or UV radiation. In one particular example, atmospheric pressure plasma such as that created with an Enercon Plasma3 unit using an 80% helium and 20% oxygen atmosphere at a moderate power level can be formed and a fabric or fiber can be treated with the plasma so as to create reactive groups that can improve wetting and binding of the fibers to thermoset resins such as epoxy or unsaturated polyester resin systems.

Layers of the disclosed composite materials can be combined according to any of a variety of suitable processes that utilize a polymeric binding agent. For purposes of the present disclosure composite formation processes have been broadly classified as either compression molding formation processes or thermoset resin molding processes. Optionally, a combination of both types of processes can be utilized to combine the layers. For example, two or more of the layers to be incorporated into the final product can first be combined via a compression molding process to form an intermediate laminate, and following this initial process one or more intermediate laminates can be combined with one another or with additional layers via a thermoset resin molding process to produce the finished composite structure.

In one embodiment, a compression molding process can be utilized in which layers can be compression molded to one another with the inclusion of a low melt thermoplastic binding agent as a matrix material within and/or between the layers of the composite. For example, in one embodiment, a layer of a low melt thermoplastic film can be included between other layers of the composite. According to this embodiment, the thermoplastic film can have a melt temperature less than that of the materials of the adjacent layers, and in particular, less than that of the high modulus polypropylene fiber. Upon addition of heat and pressure during a compression molding process, the thermoplastic film can at least partially melt and act as the binding agent.

In another embodiment, a thermoplastic resin binding agent can be coated onto individual yarns, fibers or layers prior to assembly of the composite structure. For example, individual yarns or fibers and/or finished layers of the composite can be extrusion coated with a thermoplastic resin having a lower melting point than that of the high modulus polypropylene fibers. Upon application of heat and pressure during a compression molding process, the thermoplastic material can at least partially melt and securely attach the layers together.

Possible thermoplastic resins and films for use as a binding agent in compression molding processes can include, for example, low melt polyethylenes, low melt polypropylene copolymers, or low melt fluoropolymers, as are generally known in the art. Adjacent layers that can be secured via compression molding processes can be the same or different from one another. For example, while two or more adjacent and essentially identical polypropylene fabrics can be secured utilizing compression molding processes, such processes can also be utilized to secure layers that are not identical.

Adjacent layers of the disclosed composites can also be secured to one another via a thermoset resin molding process utilizing a thermoset-binding agent. As is generally known in the art, such a process can include applying a thermoset matrix resin to one or more individual layers or optionally to the fibers forming an individual layer, bringing the individual layers into proximity with one another, shaping the multi-layer structure, such as in a mold, and curing the thermoset resin to secure the layers together, optionally curing while the structure is held under pressure. Optionally, the thermoset resin can be applied to the multi-layered structure after the individual layers have been brought together and shaped, for instance via injection of a liquid thermoset bind agent into the mold, but in any case, following cure of the thermoset resin, the resin can form a matrix around and among other constituents of the composites and secure the structure.

Suitable thermoset resins for use according to this embodiment can generally include any standard thermoset matrix resin. Optionally, and depending upon the desired product use, thermoset resins can be chosen based upon specific physical or electrical characteristics of the material. For example, when considering formation of a composite structure for use in an electric application, it may be beneficial to utilize a low loss thermoset resin such as is generally known in the art.

Exemplary thermoset resins suitable for use in forming the composite structures of the present invention can include, but are not limited to, phenolic polymers, melamine polymers, epoxies, silicones, unsaturated polyesters, polyurethanes, polyamides, polybutadienes, polyether block amides, polyetherimides, polyimides, polyureas, vinyl esters, fluoropolymers, cyanate esters, polyisoprenes, diene block copolymers, polyethylene terephthalate (PET), and the like.

Individual layers of the disclosed structures and/or the polymeric binding agents used in the composite structures can include fillers and/or reinforcement materials, as are generally known in the art. For example, one or more layers can be a fibrous reinforced fabric, for instance a fiberglass reinforced fabric, or the like. In addition, individual layers and/or binding agents of the disclosed composites can include fillers as are generally known in the art. For example, ceramic fillers such as silica or fillers such as carbon black can be included in one or more layers, or optionally in the polymeric binding agents or other matrix materials of the disclosed composite structures. Fillers can be included in one embodiment to provide particular electrical or mechanical characteristics to the structure.

The composite structures can include specifically pre-designed materials to form a composite for use in a particular application. For example, due to the low dielectric constants of the polyolefins used in the composites, the composite structures can be beneficially used in many low loss electrical applications. In one particular embodiment, one or more layers of the composite can comprise a plurality of high modulus polypropylene fibers, and the composite structure can be essentially transparent to electromagnetic radiation. According to this particular embodiment, a construct of the invention may be beneficially utilized as a circuit board or as a protective enclosure for an electromagnetic sending and/or receiving device, such as a radome. Electrical devices of the present invention can exhibit improved characteristics as compared to previously known devices that do not include high modulus polyolefin fibers. For example, the dielectric constant and/or dielectric loss can be less than that of previously known laminates utilized in similar applications. For example, composites of the present invention can exhibit a dielectric constant of less than about 3.5 in one embodiment. In another embodiment, the dielectric constant can be lower, for example, less than about 3.0, or even lower in other embodiments, for example less than about 2.7.

In one particular embodiment, one or both exterior surfaces of a device of the invention particularly well-suited to electrical applications can include a reinforcement fiber having high thermal stability, such as glass, for example. This can enable the device to be used in high temperature processes such as those involving standard solder processes, among others.

In one embodiment, a low loss composite substrate as herein disclosed can be provided at a lower cost than many previously known low loss substrates due to the relatively low costs associated with polyolefin materials as well as the low cost formation methods that can be used in forming the composites.

In one embodiment, a composite structure of the invention can be used in forming a protective structure that can be essentially impervious to weather, dirt, and/or other elements that could damage devices that can be placed within the protective structure. In one particular embodiment, such a protective structure, and in particular, that portion of the protective structure formed of a composite of the present invention can be transparent to electromagnetic waves of various frequencies. As such, an electromagnetic wave could be provided, such as that transmitted from or received by a communications antenna, microwave tower, a radar transmitter/receiver, or any other transmission device. The protective structure could thus protect the electrical devices held within the protective structure, but would not impede the operation of the devices, as the electromagnetic waves passing to and/or from the electrical devices held within the protective structure can pass through the laminate composites of the protective structure. Such a protective laminate material can include various composite structures as herein described. For instance, in one embodiment an electromagnetically transparent laminate material can include one or both external layers composed of glass, Kevlar, or ultra-high-molecular-weight-polyethylene, in addition to one or more inner layers comprising the high modulus polypropylene fibers.

One particular example of an electromagnetically transparent protective structure is a radome within which an electromagnetic wave can be generated and transmitted from a dish antenna. The wave can then pass through the radome, and in particular through that portion of the radome comprising a composite structure as described herein. Following wave reflection from an object such as a cloud or an aircraft, the wave can pass back through the radome again and be received again at the dish antenna.

Other known methods for transmitting and/or receiving electromagnetic waves can optionally be considered for various electrical applications of the present invention, in addition to those associated with radar applications. For example, a protective structure as herein described could be utilized to house and protect lasers, masers, diodes, and other electromagnetic wave generation and/or receiving devices. In one particular embodiment, a protective structure as herein described can be utilized in conjunction with devices operating with radio frequency waves, such as those between about 100 kHz and about 100 GHz, or in one embodiment between about 1 MHz and about 50 GHz, or between about 10 MHz and about 20 GHz in another embodiment. Protective structures of the invention could be useful for protecting electrical equipment used to monitor weather patterns, to monitor air or ground traffic, or to detect the presence of aircraft, boats, or other vehicles around military facilities, including warships.

In another electrical embodiment, a laminate composite structure of the invention can be utilized as a substrate for electrical circuits, and in particular for high frequency circuits. For purposes of the present disclosure, the term 'high frequency' is herein defined to be greater than 100 KHz. Accordingly, high frequency electrical circuit boards of the invention can be beneficially utilized for circuits capable of operating at greater than about 100 KHz. In one embodiment, the substrates of the invention can be utilized in conjunction with higher frequency circuits, for example circuits operating at frequencies above about 1 MHz or even higher in other embodiments, for instance above about 1 GHz.

High frequency circuit boards have in the past been formed including conductive layers which have been adhered to substrate layers such as composites of glass and epoxy. Such glass fiber/epoxy composites have high dielectric constant and high loss, however. Composites such as those described herein including a plurality of melt extruded fibers with high modulus can have a lower dielectric constant than these previously known substrates. For example lower than about 3.0, or about 2.5, or even lower than about 2.2 in some embodiments.

Circuit boards according to the present invention can be composed of multiple layers, at least one of which includes conductive materials in a predetermined pattern so as to form an electrical circuit and at least another of which is a substrate layer including plurality of high modulus polyolefin fibers. Optionally, conductive materials can be included on multiple layers and/or different conductive materials can be included on a single layer and placed in electrical communication with one another, for instance via holes as is generally known in the industry. Optionally, one or more layers of the substrate can be formed from other non-conductive materials, for instance one or more layers of a composite material comprising glass fibers that can provide additional structural benefits to the multi-layer substrate such as, for example, low coefficient of thermal expansion, or the ability to be exposed to high temperatures for a short period of time such as in a soldering operation used to connect wires, circuit portions (e.g., transistors, capacitors, diodes, etc.) and/or external devices to the circuits located on or in the substrate.

In general the disclosed circuit boards can be used by first providing an electromagnetic signal of the appropriate frequency, transferring the signal to a circuit of the circuit board through wires, cables, solder joints, and/or other devices as are well known in the art, propagating the signal along the conductive arrangement of the circuit, which may include conductive strips and/or striplines as well as capacitors, transistors, and any other circuit components as are generally known in the art, and then receiving this signal at another element, which can be internal or external to the circuit board, as desired. External elements can include, for example, a computer chip, a memory chip, or any other external electrical device. The signal may optionally be provided via wireless communication from an antenna, or alternately a microwave power sources such as those available in integrated circuits or vacuum tubes, or any other sources as are generally known to those of ordinary skill in the art.

The disclosed circuit boards can provide the benefits of low dielectric constant and low dielectric loss, which can result in higher signal integrity, lower data loss, and lower circuit operating voltage, among other benefits that are well known in the art. The disclosed circuit boards can be an integral portion of a cellular telephone, or beneficially utilized in telephone switching equipment, computers, high power microwave devices, or any other electrical device operating in the microwave frequency as is generally known in the art.

In other embodiments, the composite structures can include one or more layers exhibiting high flexural strength and/or modulus. For example, one or more layers can be formed of a fiber glass woven or nonwoven, a polyaramid nonwoven, such as a Kevlar® fabric, or a carbon fiber mat or nonwoven. In one particular embodiment, these other materials can form the outer layers of the composite structure, with one or more high modulus polyolefin-containing layers sandwiched between the two outer layers. These outer layers could provide to the composite the benefits of these particular materials, but the composite structure can still be a much lower weight construct and/or lower cost construct than previously known composites while still attaining the desired strength characteristics due to the inclusion of the low cost, low density, and high modulus polyolefin fibers in layers of the composite.

For example, the disclosed composites can be used in forming extremely strong yet lightweight materials for use in body armor, vehicle parts including car chassis and bumpers, boat hulls, and helmets. In one embodiment, a composite structure of the invention can have a low average density, for instance less than about 1.5 g/cm$^3$. In other embodiments the average density can be even less, for example less than about 1.2 g/cm$^3$, or lower yet, such as less than about 1.1 g/cm$^3$. These materials can also exhibit excellent flexural strength and flexural modulus characteristics. For example the flexural strength of the composite materials can be greater than about 80 MPa, greater than about 100 MPa, or greater than about 150 MPa, in various embodiments of the invention. The flexural modulus can be quite high as well, for example greater than about 3 GPa, in one embodiment, or higher yet in other embodiments, for example greater than about 10 GPa, or greater than about 15 GPa, in other embodiments.

As is well known in the art, stiffness of a laminate composite such as those herein disclosed increases proportionally with the cube of the thickness of the composite. In addition, the bulk of the load will be born by the outer layers of the composite. According to the present invention, composites can be designed and constructed that can describe increase in thickness without the expected corresponding increase in weight, via the inclusion of the low-density materials in the composite. In addition, the disclosed composite structures can take maximum advantage of stiffer, yet heavier and/or more expensive materials at the exterior layers of the composite. Thus, excellent strength characteristics can be attained in the composites at a reduced cost and/or weight as compared to previously known composites that incorporate the higher modulus materials (e.g., glass, Kevlar®, etc.) throughout the construct.

The present invention may be better understood with reference to the following examples.

EXAMPLE

High modulus, multi-filament polypropylene yarns were formed according to a process such as that illustrated in FIG. 1. These high modulus polypropylene yarns were incorporated into woven fabrics on a narrow loom. The fibers were 1600 denier and 48 filament polypropylene fibers with a modulus of 16 GPa and tenacity of 700 MPa, and were included in the fabric at 12 picks per inch. The weft was made of 1200 denier low modulus polypropylene yarn as are well known in the art. These woven fabrics were then utilized in forming multi-layer composite structures as herein described. These fabric layers are designated HMPP in the tables and figures that follow. Prior to inclusion in the composite structures, these fabrics were plasma treated on an Enercon Plasma3 plasma treatment device using an atmosphere of 80% helium, 20% oxygen at a gap of 0.04 inches, 50 ft/min, and 2 kW power. Prior to this treatment, the dyne level of the fabric was 32 according to Enercon's measurement method, and after the treatment the dyne level had been raised to 66. (A dyne level of 72 corresponds to water wetting.)

The HMPP layers were combined with other materials to form composite structures as herein described. Other layers utilized are designated as follows:

| | |
|---|---|
| GLA | fiberglass fabric, available from Fiberglast Company, product no. 245-C. |
| CAR | carbon fiber fabric, available from Defender Industries, product no. 751434. |
| PP | low modulus polypropylene woven fabric, available from Defender Industries, product no. 751422. |
| PET | polyethylene terephthalate fiber woven fabric, available from Defender Industries, product no. 751425. |
| KEV | Kevlar ® fabric, available from Defender Industries, product no. 751429. |
| HMPP | High modulus polypropylene yarn woven fabric as described above. |

Individual layers were coated with a thermoset resin selected from PET-F (77-A polyester molding resin, Fiberglast Company), PET-TAP (8777 Marine Vinyl Ester Resin, available from TAP Plastics), and epoxy-TAP (made from 8752 Marine Epoxy A Side Resin and 8722 Medium B Side Hardener in a 4:1 ratio, both from TAP Plastics). Layers were then brought together, the mold was hand tightened with c-clamps and the thermoset resin was allowed to cure. Composites were prepared as shown below in Table 1. (Composites labeled as 4/5 alternating include 4 layers of the first listed material alternating between 5 layers of the second material with the second listed material forming the exterior layers of the construct.)

TABLE 1

| Sample Number | Number of Layers | Layer Composition | Resin | Density (g/cm³) | Dielectric Constant | Flexural Strength (MPa) | Flexural Modulus (GPa) |
|---|---|---|---|---|---|---|---|
| 1 | 8 | HMPP | PET-F | 1.06 | 2.769 | 93 | 3.8 |
| 2 | 6 | GLA | PET-F | 1.58 | 3.908 | 199 | 11.8 |
| 3 | 1/6/1 | GLA/HMPP/GLA | PET-F | 1.17 | 2.94 | 132 | 9.2 |
| 4 | 1/6/1 | CAR/HMPP/CAR | PET-F | 1.11 | | | |
| 5 | 8 | PP | PET-F | 1.02 | 2.699 | 64 | 2 |
| 6 | 8 | PET | PET-F | 1.23 | 3.187 | 68 | 2.8 |
| 7 | 1/6/1 | KEV/HMPP/KEV | PET-F | 1.09 | 2.837 | 135 | 8.1 |
| 8 | 1/6/1 | CAR/HMPP/CAR | PET-F | 1.11 | 3.334 | 133 | 15.1 |
| 9 | 8 | HMPP | PET-F | 1.01 | | | |
| 10 | 1/6/1 | GLA/HMPP/GLA | PET-F | 1.18 | | | |
| 11 | 8 | HMPP | PET-TAP | 0.98 | 2.4286 | 62.2 | 3.4 |
| 12 | 1/6/1 | GLA/HMPP/GLA | PET-TAP | 1.20 | 2.746 | 90.6 | 11.3 |
| 13 | 2/4/2 | GLA/HMPP/GLA | PET-TAP | 1.40 | 3.1235 | 163.9 | 17.4 |
| 14 | 1/6/1 | KEV/HMPP/KEV | PET-TAP | 1.08 | 2.669 | 76.5 | 10.5 |
| 15 | 2/4/2 | KEV/HMPP/KEV | PET-TAP | 1.11 | 2.8892 | 132.8 | 19.7 |
| 16 | 1/6/1 | CAR/HMPP/CAR | PET-TAP | 1.08 | | 99.4 | 17.1 |
| 17 | 2/4/2 | CAR/HMPP/CAR | PET-TAP | 1.19 | | 157.1 | 11.1 |
| 18 | 4/5 alternating | HMPP/GLA | PET-TAP | 1.45 | 3.2745 | 123.9 | 19.8 |
| 19 | 8 | GLA | PET-TAP | 1.86 | 4.5563 | 197.8 | 18.8 |
| 20 | 8 | HMPP | Epoxy-TAP | 1.01 | 2.6609 | 81.9 | 5.1 |
| 21 | 1/6/1 | GLA/HMPP/GLA | Epoxy-TAP | 1.19 | 2.9732 | 130.9 | 12.6 |
| 22 | 2/4/2 | GLA/HMPP/GLA | Epoxy-TAP | 1.41 | 3.3276 | 186.6 | 16.4 |
| 23 | 1/6/1 | KEV/HMPP/KEV | Epoxy-TAP | 1.08 | 2.7934 | 124 | 15.8 |
| 24 | 2/4/2 | KEV/HMPP/KEV | Epoxy-TAP | 1.16 | 3.0519 | 138.3 | 18.3 |
| 25 | 1/6/1 | CAR/HMPP/CAR | Epoxy-TAP | 1.06 | | 100.8 | 19.6 |
| 26 | 2/4/2 | CAR/HMPP/CAR | Epoxy-TAP | 1.19 | | 208.9 | 27.8 |
| 27 | 4/5 alternating | HMPP/GLA | Epoxy-TAP | 1.46 | 3.4273 | 121.2 | 13.8 |
| 28 | 8 | GLA | Epoxy-TAP | 1.84 | 4.7469 | 191.5 | 13.8 |

FIGS. 5-8 illustrate the physical characteristics of exemplary composite structures of the present invention (specifically, sample nos. 20-27 from Table 1, above) in comparison to a composite formed of eight layers of a fiberglass material in combination with an epoxy resin (sample number 28 from Table 1, above). As can be seen with reference to the Figures and the Table, composites of the present invention can have a low dielectric constant and high strength characteristics at a lower overall density as compared to previously known composite materials.

Example 2

Eight layers of HMPP fabric were layered alternating with a polyethylene film, and then compressed at 150° C. and 8,000 psi for 5 minutes. The resulting composite had good stiffness and extraordinary toughness.

In addition, eight layers of HMPP fabric were layered alternating with a random copolymer polypropylene (RCP) film under similar conditions. The resulting composite was stronger and stiffer than the composite including the polyethylene film, and still extraordinarily tough.

As a comparative example, eight layers of HMPP fabric were overlaid together with no polymeric binding agent. Three identical structures were compressed at 150° C., 155° C., and 160° C., respectively, and held at 8000 psi for 30 minutes. In each case, the resulting layers peeled apart easily, and at 160° C., the fibers were found to have shrunk to one half of their original length.

It will be appreciated that the foregoing examples, given for purposes of illustration, are not to be construed as limiting the scope of this invention. Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention that is defined in the following claims and all equivalents thereto. Further, it is recognized that many embodiments may be conceived that do not achieve all of the advantages of some embodiments, yet the absence of a particular advantage shall not be construed to necessarily mean that such an embodiment is outside the scope of the present invention.

What is claimed is:

1. A method comprising:
   i) providing an electromagnetic wave at a frequency between about 100 kHz and about 100 GHz;
   ii) placing a laminate structure in the path of the electromagnetic wave, the laminate structure comprising a fabric layer comprising a plurality of semi-crystalline multi-filament polypropylene fibers having a modulus greater than about 8 GPa and exhibiting at least one of the following characteristics: a) a tenacity greater than 400 MPa, b) greater than 80% crystallinity according to WAXS measuring techniques, and c) a ratio of equatorial intensity to meridonal intensity of greater than 1.0 as measured by SAXS techniques, wherein the laminate structure is essentially transparent to electromagnetic energy and exhibits a dielectric constant of less than about 3.5; wherein said polypropylene fibers alone exhibit a dielectric constant of less than about 3.5, and wherein said polypropylene fibers further exhibit a capability to impart a flexural strength of at least 80 MPa to a laminate structure of eight fabric layers consisting of said polypropylene fibers as the only fibers present; and iii) passing the electromagnetic wave through the laminate structure.

2. The method of claim 1, wherein the electromagnetic wave is transmitted from a dish antenna.

3. The method of claim 1, wherein the laminate structure is a portion of a protective enclosure housing an electromagnetic wave transmitter, and electromagnetic wave receiver, or both.

4. The method of claim 1, wherein the fabric layer comprising the polypropylene fibers is an inner layer of the laminate structure, the laminate structure further comprising an external layer comprising fibers selected from the group consisting of glass fibers, polyaramid fibers, and ultra-high molecular weight polyethylene fibers.

5. The method of claim 4, in which the external layer is a fiberglass fabric.

6. The method of claim 1, further comprising reflecting the electromagnetic wave off of an object, and subsequently passing the electromagnetic wave through the laminate structure a second time.

7. The method of claim 6, wherein the object is a cloud.

8. The method of claim 6, wherein the object is a vehicle.

9. The method of claim 8, wherein the object is an aircraft.

10. The method of claim 1, wherein the fabric layer is a weave fabric comprising the polypropylene fibers in an interlaced pattern with a plurality of second fibers.

11. The method of claim 1, in which the laminate structure comprises a low loss thermoset resin.

12. A method comprising:

i) providing an electromagnetic wave at a frequency between about 100 kHz and about 100 GHz;

ii) placing a laminate structure in the path of the electromagnetic wave, the laminate structure comprising a fabric layer comprising a plurality of semi-crystalline multi-filament polypropylene fibers having a modulus greater than about 8 GPa and a maximum cross sectional dimension less than about 100 microns;

wherein the laminate structure is essentially transparent to electromagnetic energy and exhibits a dielectric constant of less than about 3.5;

wherein said polypropylene fibers alone exhibit a dielectric constant of less than about 3.5; and wherein said laminate structure has an average density less than about 1.5 g/cm$^3$, a flexural strength greater than about 100 MPa, and a flexural modulus greater than about 10 GPa; and iii) passing the electromagnetic wave through the laminate structure.

* * * * *